United States Patent [19]

Kobayashi et al.

[11] 3,886,582

[45] May 27, 1975

[54] FIELD EFFECT TRANSISTOR

[75] Inventors: Kazuyoshi Kobayashi, Katsuhiko Akiyama, both of Atsugi, Japan

[73] Assignee: Sony Corporation, Tokyo, Japan

[22] Filed: Jan. 2, 1974

[21] Appl. No.: 430,081

Related U.S. Application Data

[63] Continuation of Ser. No. 241,310, April 5, 1972, abandoned.

[52] U.S. Cl. ...................... 357/22; 357/23; 357/52; 357/54

[51] Int. Cl. ............................................ H01l 11/14

[58] Field of Search .................... 357/22, 23, 52, 54

*Primary Examiner*—Martin H. Edlow

*Attorney, Agent, or Firm*—Hill, Gross, Simpson, Van Santen, Steadman, Chiara & Simpson

[57] ABSTRACT

A field effect transistor with small gate leakage current; the gate leakage current being substantially reduced by a low-temperature glass layer formed on a portion of the surface. It is well known that an inversion layer occurs in a P-type region under an oxide layer, such as silicon dioxide, by ions contained in the oxide layer and/or electric fields applied between the P-type region and a conductive layer formed thereon. In a field effect transistor, the inversion layer increases the leakage current by decreasing the impurity concentration at the surface of the semiconductor body. This is especially true in the P-type region. This decrease of impurity concentration lowers the input impedance. The present invention replaces an oxide layer on a P-type region with a low-temperature glass layer and substantially reduces or eliminates gate leakage current.

2 Claims, 18 Drawing Figures

PRIOR ART

FIELD EFFECT TRANSISTOR

This is a continuation, of application Ser. No. 241,310 filed Apr. 5, 1972 now abandoned.

BACKGROUND OF THE INVENTION

One form of conventional junction field effect transistor includes a P-type silicon substrate having an N-type region diffused therein to form a channel and a P-type gate region diffused in the N-type region. High impurity source and drain regions are formed in the N-type region at opposite ends thereof. Ohmic contacts are metallized on the surface of the end channel over the source and drain regions. A third ohmic contact is connected to both P-type regions to form the gate. A silicon dioxide coating covers the upper surface except for openings through which the ohmic contacts extend to the drain, source and gate, respectively.

This type of construction has had the disadvantage of having a gate leakage current due to the inversion layer when an opposite voltage is applied to the drain electrode if an impurity concentration of about $10^{19}$ atoms/cc is employed to prevent or substantially eliminate the inversion layer. However, an impurity concentration of $10^{20}$ atoms/cc is about the highest limit if a diffusion technique is employed, while the impurity in the semiconductor body of $10^{20}$ atoms/cc concentration diffuses into the silicon dioxide layer during thermal oxidation so that the surface concentration is reduced to $10^{19}$ to $10^{18}$ atoms/cc.

SUMMARY OF THE INVENTION

It is an object of this invention to provide a field effect transistor having a high input impedance, in which an oxide layer on a P-type region is replaced with a low-temperature glass layer.

It is a further object of the present invention to provide a novel method for making a field effect transistor having a high input impedance and low gate leakage current characteristics.

Still another object of the present invention is to provide a novel field effect transistor having a layer portion of silicon dioxide covering the ends of pn junctions reaching the surface of the transistor and having a low-temperature glass layer covering the remaining portions of said transistor as well as silicon dioxide layer portions.

Yet another object of the present invention is to provide a novel field effect transistor having a layer portion of silicon dioxide covering the ends of pn junctions reaching the surface of the transistor and having a low-temperature glass layer covering the remaining portions of said transistor as well as silicon dioxide layer portions and further having a phosphorus-silicate glass layer covering the low-temperature glass layer.

Still another object of the present invention is to provide a novel field effect transistor having a layer portion of silicon dioxide covering the ends of pn junctions reaching the surface of the transistor and having a low-temperature glass layer covering the remaining portions of said transistor as well as silicon dioxide layer portions and further having a phosphorus-silicate glass layer covering the low-temperature glass layer and having a low temperature silicon dioxide glass layer covering said phosphorus-silicate glass layer and having a silicon nitride layer covering said last mentioned layer.

DETAILED DESCRIPTION

As hereinbefore pointed out, it is well known that an inversion layer occurs in a P-type region under the oxide layer such as silicon dioxide by ions contained in the oxide layer and/or electric fields applied between the P-type region and a conductive layer formed thereon. In a field effect transistor, the inversion layer increases the leakage current and hence lowers the input impedance.

Figure 1:
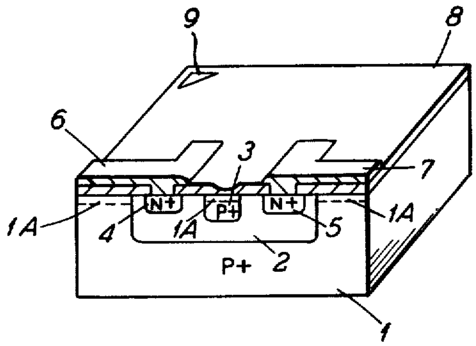
FIG. 1 is a diagrammatic view of a prior art form of field effect transistor.

FIG. 1 shows a conventional field effect transistor including a P-type silicon region 1, an N-type region 2, a P-type gate region 3 formed in the N-type region 2, and source and drain regions 4 and 5 formed in the N-type region, respectively. Ohmic contacts 6 and 7 are formed on a thermally grown silicon dioxide layer 8 and connect with the source and drain electrodes. 9 designates an ohmic contact connecting with the P-type region 1 to act as the gate electrode. In this example, an inversion layer 1A is easily caused by ions contained in the silicon dioxide layer which increase the leakage current between the gate electrode and drain or source electrodes.

The present invention contemplates the use of low-temperature glass and for the purposes of this application the term "low-temperature glass" is defined as any nonsemiconductor dielectric which can be deposited on a semiconductor body without raising the temperature of the semiconductor body to form significant silicon dioxide on the body. The lowtemperature glass can be grown by low temperature passivation techniques at temperatures which are normally below 400° to 900° C. One technique hereinafter described in detail is the use of chemical vapor deposition to grow a layer of silicon dioxide and silicon nitride. Other suitable techniques would be the use of vapor deposition, the use of epitaxial techniques to form epitaxial reaction glasses and the use of anodic oxidation to grow a layer of silicon dioxide.

Figure 2:
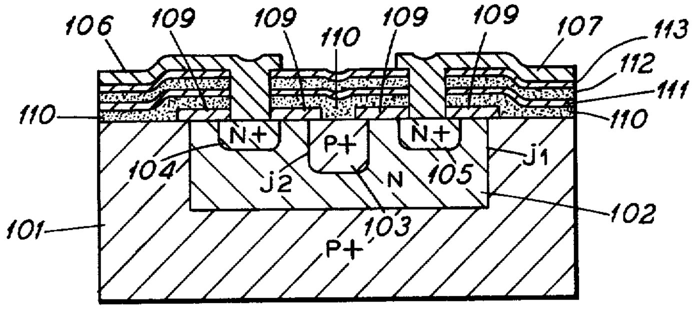
FIG. 2 is an enlarged diagrammatic cross-sectional view in elevation of a field effect transistor embodying the novel teachings of the present invention, as taken along the line 2—2 of FIG. 3.
Figure 3:
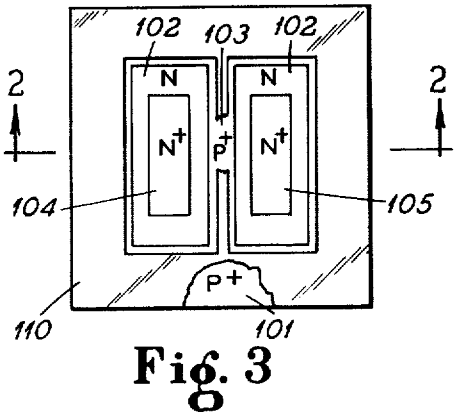
FIG. 3 is a reduced sectional view of the form of construction shown in FIG. 2.

Referring now to FIGS. 2 and 3 of the drawings, there is shown therein a field effect transistor embodying the teachings and principles of this invention. In this embodiment of the invention, 101, 102, 103, 104, 105, 106 and 107 correspond to 1, 2, 3, 4, 5, 6 and 7 shown in FIG. 1, respectively. A thermally grown silicon dioxide layer 109 selectively exists at least on pn junctions $j_1$ and $j_2$, while a low-temperature glass layer 110 is directly in contact with P-type regions 101 and 103 at the area shown in FIG. 3. The lowtemperature glass layer is made of silicon dioxide formed by chemical vapor deposition (CVD). The thermally grown silicon diode layer 109 is generally more stable physically and grows into a semiconductor body to form a clean and stable interface over a former surface of the semiconductor body even if the surface of the semiconductor body was stained. Therefore, the thermally grown silicon dioxide layer 109 is suitable f r a passivation on a pn junction.

An inversion layer occurs under the silicon dioxide layer 109 but does not occur under the low-temperature glass layer 110, so that the inversion layer does not electrically connect between gate and source or drain therethrough.

111 designates a phosphorus-silicate glass layer grown on the low-temperature glass layer 110 by diffusing a phosphorus pentoxide vapor into the silicon dioxide layer 110 at 700°–1000° C. The phosphorus-silicate glass 111 is convenient to getter sodium ions from the outside during treatment. On the phosphorus-silicate glass layer 111, a low-temperature glass layer 112 and silicon nitride ($Si_3N_4$) layer 113 are formed to prevent a penetration of sodium ions therethrough. The low-temperature glass layer 112 (made of silicon dioxide) is necessary to isolate the silicon nitride layer 113 from the phosphorus-silicate glass layer 111, because phosphorus contained in the layer 111 tends to form pinholes in the silicon nitride layer 113 as depositing silicon nitride thereon.

The phosphorus-silicate glass layers 111, the low-temperature glass layer and the silicon nitride layer are logically unnecessary to reduce a leakage current but are preferable to improve stability and the electrical characteristics. These layers, of course, increase the distance between leads 106 and 107 and a semiconductor surface to reduce the influence of electric fields.

A surface impurity concentration of the P-type regions 101 and 103 is preferably selected as a high impurity concentration, such as $10^{20}$ atoms/cc, in order to prevent an inversion layer due to electric fields.

Figure 4:
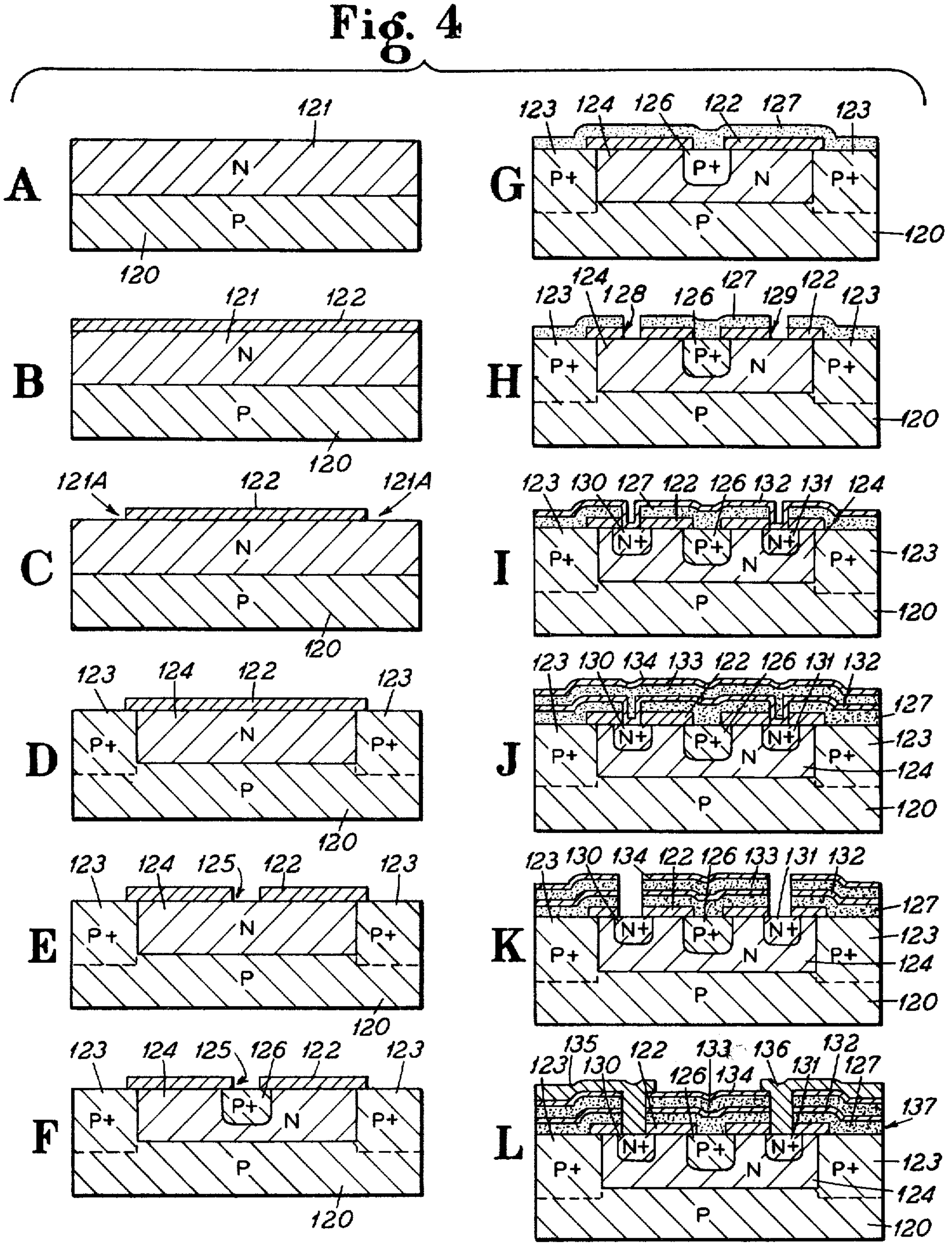
FIG. 4A-4L is a series of views illustrating successive steps in the forming of a field eff ct transistor of the type shown in FIG. 2.

FIG. 4 shows a method of making the field effect transistor of this invention. The steps include:

1. Providing a P-type silicon substrate 120 and forming an N-type epitaxial growth layer 121 on the substrate 120, (FIG. 4A), with impurity concentrations of the substrate and epitaxial layer preferably selected to be $10^{18}$–$10^{19}$ atoms/cc and $10^{15}$–$10^{16}$ atoms/cc, respectively.
2. Forming a thermally grown silicon dioxide layer 122 on the epitaxial layer 121, (FIG. 4B).
3. Removing an isolation portion 121A of the silicon dioxide layer 122 by etching, (FIG. 4C).
4. Diffusing a P-type impurity into the substrate 120 through the epitaxial layer 121 to form an N-type island 124 and an isolation diffusion region 123, (FIG. 4D), the surface concentration of the isolation diffusion region 123 being selected to be about $10^{20}$ atoms/cc.
5. Selectively removing the silicon diode layer 122 to form a window 125, (FIG. 4E).
6. Diffusing a P-type impurity into the island 124 to form a gate region 126 having an impurity concentration of $10^{20}$ atoms/cc, (FIG. 4F), both ends of the gate region 126 being continuous with the diffusion region 123.
7. Forming a low-temperature silicon dioxide glass layer 127 on the silicon dioxide layer 122, the diffusion region 123 and the gate region 126 by chemical vapor deposition reacting monosilane $SiH_4$ with carbon dioxide $CO_2$ and hydrogen $H_2$ at the temperature ranging 800° to 900° C., (FIG. 4G).
8. Selectively removing the low-temperature glass layer 127 and the silicon dioxide layer 122 to form windows 128 and 129, (FIG. 4H).
9. Diffusing phosphorus into the island 124 through the windows 128 and 129 to form a source region 130 and a drain region 131, a phosphorus-silicate glass layer 132 being simultaneously produced on the low-temperature glass layer 132, (FIG. 4I).
10. Forming a silicon dioxide layer 133 on the phosphorus-silicate glass layer 132 by chemical vapor deposition and next forming a silicon nitride layer 134 on the silicon dioxide layer 133 by chemical vapor deposition reacting monosilane with ammonia, (FIG. 4J).
11. Removing five layers 122, 127, 132, 133 and 134 on the drain and source regions 130 and 131 and on the diffusion region 123 to form three windows, one window not being shown in the drawings, (FIG. 4K).
12. Vapor depositing aluminum layers selectively to form a gate electrode (not shown), a source electrode 135 and a drain electrode 136 to obtain a field effect transistor 137.

Example

A water of P-type silicon single crystal semiconductor material having a resistivity of 0.01 ohm-centimeter and doped with boron was prepared for the growth of N-type layer on one surface of the wafer.

The wafer was placed in a vapor growth apparatus and heated to 1175° C. A reactant gas was then introduced into the apparatus and caused to flow over at least one surface of the wafer. The reactant gas used was a mixture of hydrogen, silicon tetrachloride and phosphorus which was continued 10 minutes until an epitaxial growth, 3 microns in thickness and having a resistivity of 1 ohm-centimeter, resulted.

The wafer was then exposed to an atmosphere of steam and oxygen. Oxygen flowing at the rate of 2 liters per minute, was caused to flow over the exposed N-type layer for 30 minutes. The exposed N-type layer was oxidized to silicon dioxide to a depth of approximately 4200 angstrom units.

The wafer was removed from the apparatus and employing a photoresist technique, a part of the silicon dioxide layer was removed to form isolation windows.

The wafer was then exposed to boron oxide vapor for 70 minutes at 1050° C. in a nitrogen atmosphere to predeposit boron on the exposed surface, and was then heated to 1100° C. for 120 minutes in a nitrogen atmosphere to diffuse boron into the P-type region.

Employing again a photoresist technique, gate windows were formed through the silicon dioxide layer. The wafer was again subjected to boron oxide vapor for 70 minutes at 1050° C. in a nitrogen atmosphere to predeposit boron on one surface of the wafer, and then heated to 1100° C. for 10 minutes in a nitrogen atmosphere until a diffusion region, 1 micron in thickness and having a surface concentration of $10^{20}$ atoms/cc, resulted.

The wafer was then placed in a vapor deposition apparatus and heated to 870° C. A gas mixture of monosilane (0.5 liters/min.), carbon dioxide (2 liters/min.) and hydrogen (20 liters/min.) was caused to flow over one surface of the water for 20 minutes. A chemical vapor deposited silicon dioxide layer having a thickness of 6000 angstrom units was formed over one surface of the wafer.

A portion of both silicon dioxide layers was selectively removed by a photoresist technique to form windows reaching to the N-type region. The wafer was then diffused with phosphorus which entered the wafer through the windows. The diffusion process employed phosphorus oxychloride as a source heated to 10° C. which was transported across the wafer heated to 1000° C. by oxygen for 3 minutes to form N-type regions having a high impurity concentration and phosphorus-silicate glass layer having a thickness of 250 angstrom units on a surface of a chemical vapor deposited silicon dioxide layer.

The wafer was removed from the diffusion apparatus and then placed in a chemical vapor deposition apparatus. A gas mixture of monosilane (0.15 liters/min.), carbon dioxide (3 liters/min.) and hydrogen (20 liters/-min.) and then a gas mixture of monosilane (0.15 liters/min.), ammonia (0.3 liters/min.) and hydrogen (20 liters/min.) were transported across the wafer heated to 870° C. for 10 minutes, respectively. The resulting silicon dioxide layer and silicon nitride layer had a thickness of 3000 angstrom units and 1000 angstrom units, respectively.

The silicon nitride layer was selectively removed by chemical etching using ortho-phosphoric acid and then the other glass layers were removed by conventional chemical etching using the silicon nitride layer as a mask, so that windows for electrodes were formed.

An aluminum layer, 1 micron thick, was deposited on one surface of the wafer by vapor deposition and then selectively removed by photoresist technique to form source, drain and gate electrodes.

Figure 5:
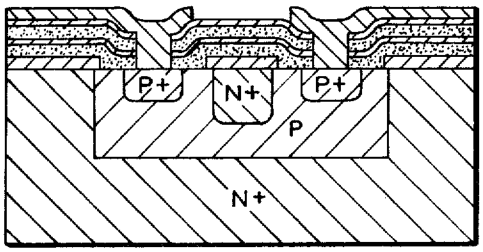
FIG. 5 is a view similar to FIG. 2 but illustrating a modified form of the present invention.

FIG. 5 shows a cross-sectional view of the P-type field effect transistor. In this embodiment, an inversion layer tends to occur on a surface of a P-type island so that a low-temperature glass layer should be formed on the P-type island except on the pn junction formed between the island and the channel.

Figure 6:
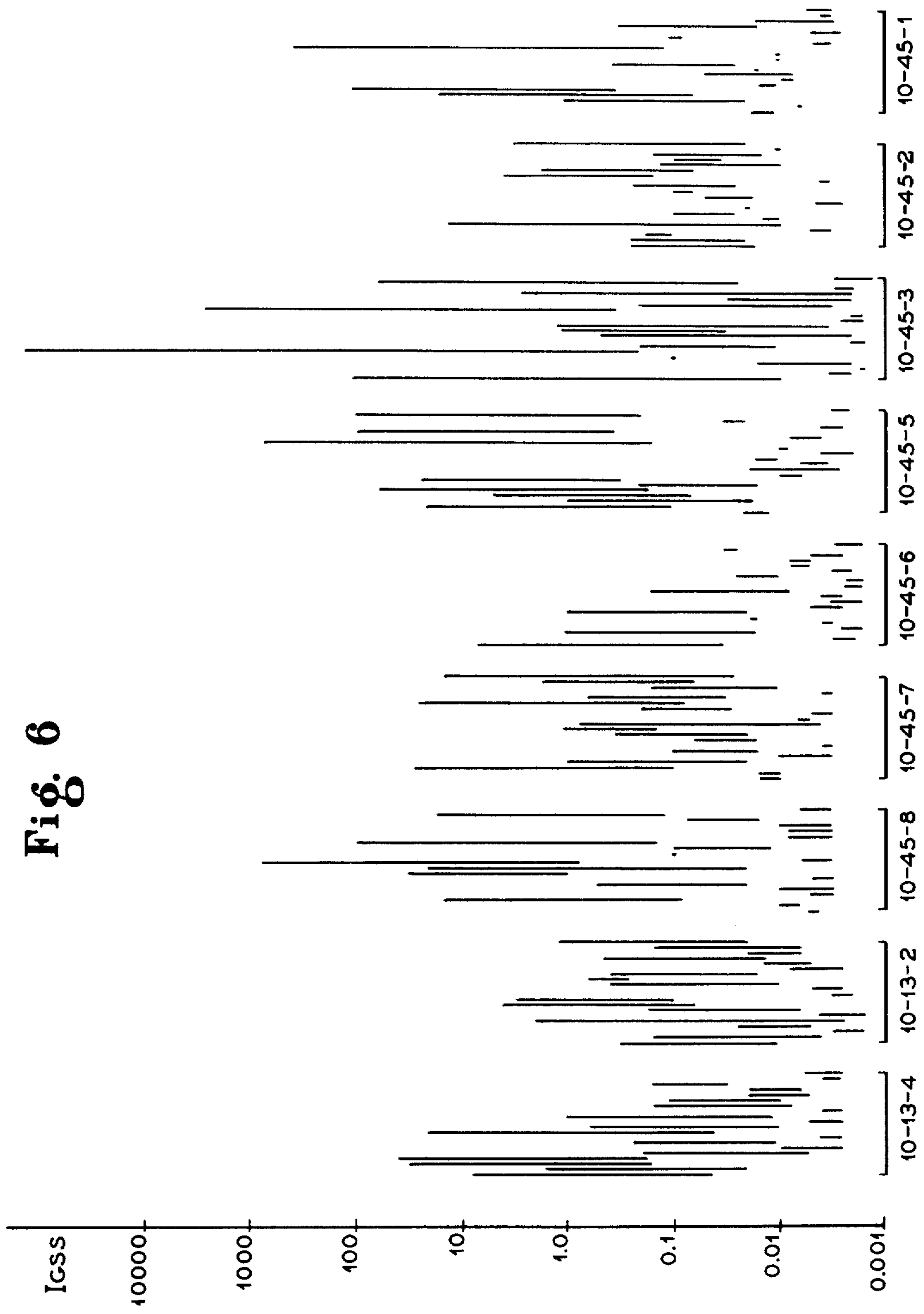
FIG. 6 is a chart demonstrating the chances of leakage current occurring between gate and source electrodes of a conventional field effect transistor such as shown in FIG. 1.

FIG. 6 demonstrates the relative frequency of objectionable leakage current $I_{GSS}$ (nanoampere) between gate and source electrodes as indicated by the examination of a number of samples of the conventional field effect transistor shown in FIG. 1. The leakage currents were measured before and after applying a bias voltage of 30 volts between a gate electrode and a source electrode shorted with a drain electrode for 24 hours at 100° C. Appearing from the results, the chances of undesirable leakage currents were very large and, as shown, 94 transistors out of 180 transistors were considered unsatisfactory.

Figure 7:
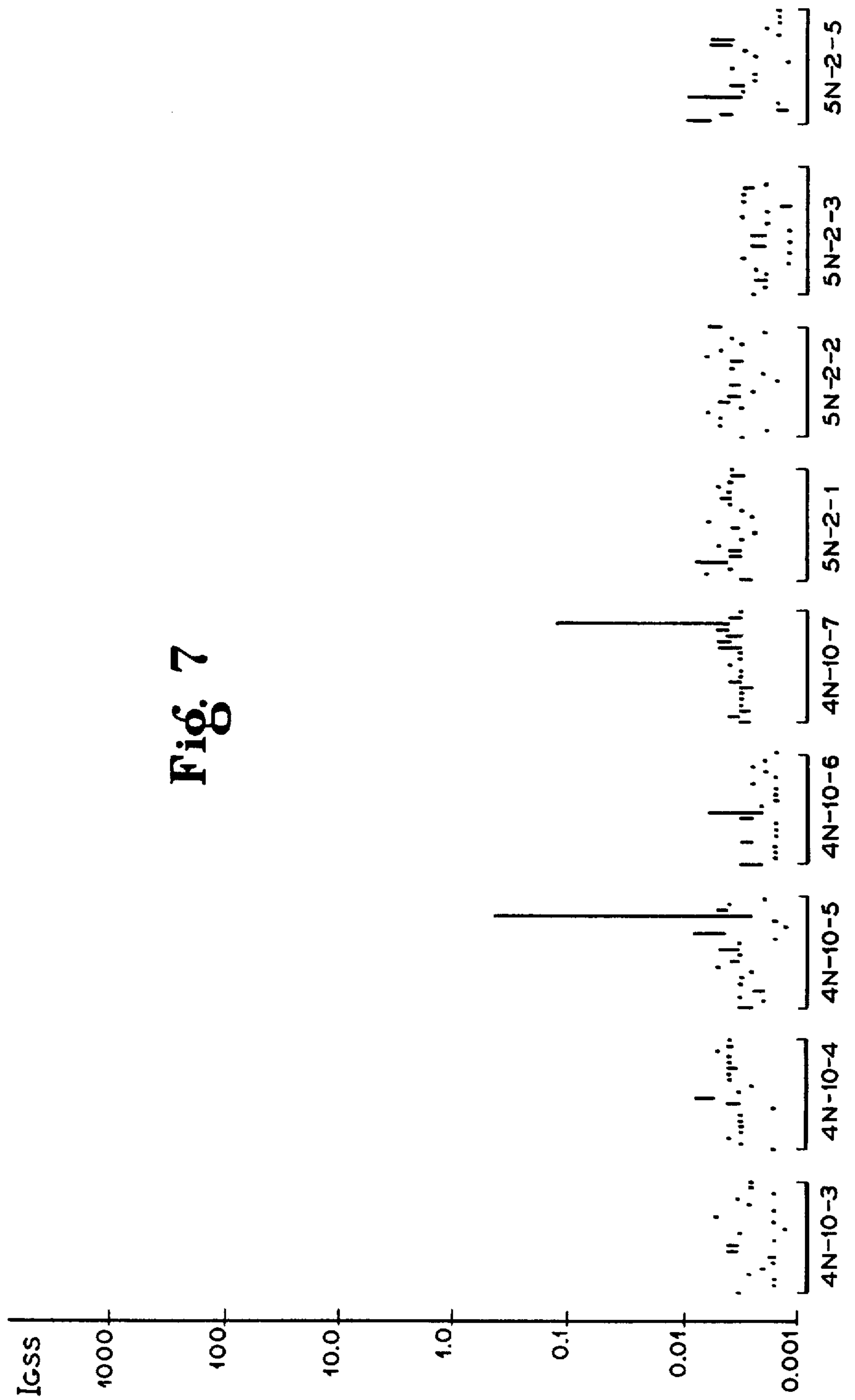
FIG. 7 is a chart similar to FIG. 6 but demonstrating the chances of leakage current occurring in a field effect transistor embodying the novel principle and structure of the present invention.

FIG. 7 demonstrates the relative frequency of undesirable leakage currents in field effect transistors of the present invention. It is noted that the chance of such occurrence is minimal. Only two transistors out of 180 transistors were unsatisfactory, but even in these the amounts were very small. These tests indicate that the field effect transistor of this invention has a high input impedance and a high reliability.

We claim as our invention:

1. A field effect transistor comprising a substrate of silicon of one conductivity type, a second region of opposite conductivity type diffused into said first region forming a first pn junction therebetween, a third high impurity region of the first conductivity type diffused into said second region forming a second pn junction therebetween and having a thin channel between said first and third regions, opposite end regions of said channel rising to the surface of said substrate and providing source and drain regions of high secondtype impurity concentration, a gate electrode on said third region, a thermally grown silicon dioxide layer formed on the upper surface of said substrate and said second region overlying the surface termination of said first and second pn junctions and leaving at least a portion of said surface of said substrate and said third region free, a low-temperature silicon dioxide glass layer formed on the remaining upper surface portion of said substrate not covered by said thermally grown silicon dioxide layer including said free surfaces of said substrate and said third region, said low-temperature glass layer also covering said thermally grown layer, a phosphorus-silicon glass layer covering said low-temperature silicon dioxide glass layer, a low-temperature silicon dioxide glass layer cover said phosphorus-silicon glass layer, and a silicon nitride layer covering said low-temperature silicon dioxide glass layer.

2. A field effect transistor according to claim 1, in which drain and source electrodes are formed on the surface of said silicon nitride layer and extend through windows respectively through all of said layers to said source and drain regions.

* * * * *